United States Patent
Dreier et al.

[11] Patent Number: 5,089,082
[45] Date of Patent: Feb. 18, 1992

[54] PROCESS AND APPARATUS FOR PRODUCING SILICON INGOTS HAVING HIGH OXYGEN CONTENT BY CRUCIBLE-FREE ZONE PULLING, SILICON INGOTS OBTAINABLE THEREBY AND SILICON WAFERS PRODUCED THEREFROM

[75] Inventors: Peter Dreier; Wilfried von Ammon; Heinz Winterer, all of Burghausen, Fed. Rep. of Germany

[73] Assignee: Wacker-Chemitronic Gesellschaft fur Elektronik-Grundstoffe mbH, Burghausen, Fed. Rep. of Germany

[21] Appl. No.: 591,703

[22] Filed: Oct. 2, 1990

[30] Foreign Application Priority Data

Nov. 24, 1989 [DE] Fed. Rep. of Germany ....... 3938937

[51] Int. Cl.$^5$ ............................................. C30B 13/00
[52] U.S. Cl. ............................. 156/620.4; 156/620.73; 156/620.74; 156/DIG. 64; 156/DIG. 68; 422/250; 422/251; 148/33; 148/33.6
[58] Field of Search ........... 156/620.4, 620.73, 620.74, 156/DIG. 64, DIG. 88, 605, 606; 422/250, 251; 148/33, 33.6

[56] References Cited

U.S. PATENT DOCUMENTS 3,342,970 9/1967 Emeis .............................. 156/620.73
3,453,352 7/1969 Goundry .................... 156/DIG. 64

FOREIGN PATENT DOCUMENTS 2054532 5/1972 Fed. Rep. of Germany ....................... 156/620.74

OTHER PUBLICATIONS

Brissot et al., "Preparation of Artificial Calcite Single Crystals by Solvent Zone Melting"; *Journal of Crystals* 8(1971) pp. 213–215.
Proposed Floating-Zone, Immersed-Heater Method for the Growth of Trigonal Selenium Single Crystals; Swinehart; *Journal of Crystal Growth* 26 (1974) pp. 317–318.

*Primary Examiner*—Robert Kunemund
*Assistant Examiner*—Felisa Garrett
*Attorney, Agent, or Firm*—Collard, Roe & Galgano

[57] ABSTRACT

Silicon ingots, in particular, with diameters of approximately 75 mm and greater, can be produced by zone pulling with an oxygen content comparable to crucible-pulled material if a flat quartz element is brought into contact with the molten cap during the pulling operation. A quartz ring which is arranged concentrically beneath the induction heating coil and can be lowered from a rest position into its working position on the molten cap is suitable as a flat element. The ingot material obtained in this manner and also the silicon wafers produced therefrom combine the purity advantages of zone-pulled silicon with the beneficial gettering and hardening action of the incorporated oxygen which otherwise distinguishes only crucible-pulled silicon.

9 Claims, 1 Drawing Sheet

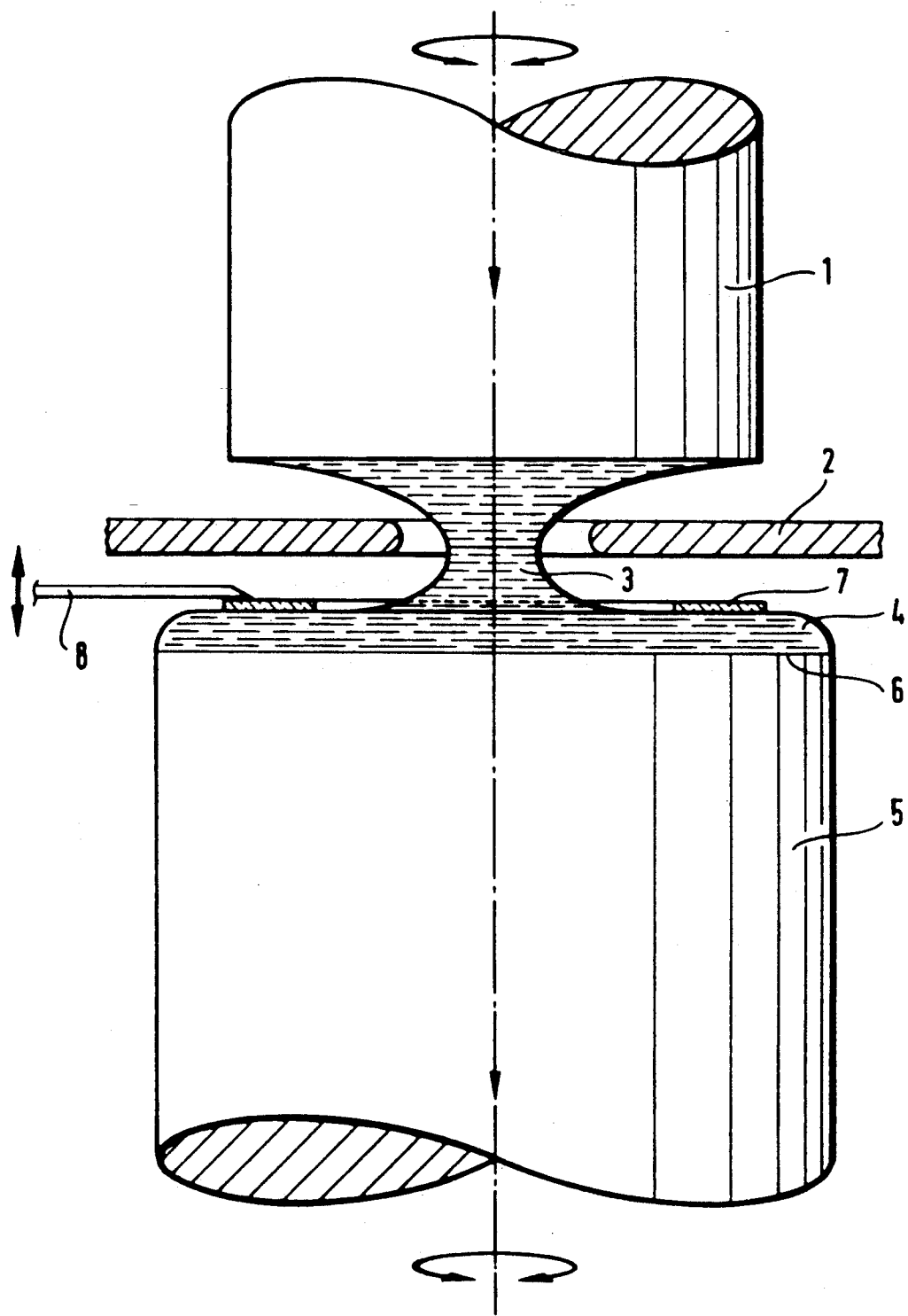

PROCESS AND APPARATUS FOR PRODUCING SILICON INGOTS HAVING HIGH OXYGEN CONTENT BY CRUCIBLE-FREE ZONE PULLING, SILICON INGOTS OBTAINABLE THEREBY AND SILICON WAFERS PRODUCED THEREFROM

BACKGROUND OF THE INVENTION

The present invention relates to a process and apparatus for producing silicon ingots having a high oxygen content by crucible-free zone pulling, silicon ingots obtainable thereby and silicon wafers produced therefrom.

More particularly, the invention relates to such a process wherein a molten zone is produced between a feed ingot and a product ingot with the aid of a surrounding induction heating coil. Starting from the feed ingot, the molten zone passes through the annular hole of the coil in the form of a molten neck and then expands to form a molten cap covering the product ingot, the molten zone being brought into contact with quartz shaped parts during the pulling process.

In the processes for producing electronic components having high packing density from silicon wafers, the oxygen content of the silicon plays an ever more important role. The reason is that the intrinsic gettering action of the oxygen is ever more frequently exploited in certain process steps. In microelectronics, use is, therefore, almost exclusively made of silicon which has a minimum oxygen content of about $10^{16}$ atoms of oxygen/cm$^3$. Such silicon is obtained by Czochralski crucible pulling, since oxygen is accumulated in the melt and incorporated in the growing crystal ingot in the course of the pulling operation as a result of the reaction between the silicon melt and the quartz crucible. In addition, the oxygen incorporated also has a certain hardening effect.

On the other hand, silicon obtained by crucible-free zone pulling has a markedly lower oxygen content of typically about $10^{15}$ to $10^{16}$ atoms of oxygen/cm$^3$ of silicon owing to the lack of contact between the silicon melt and quartz crucible. Instead, it is distinguished, however, by higher purity and higher minority carrier lifetime compare with crucible-pulled material and also by the fact that particularly high resistances can be achieved. The main field of application of the zone material is, therefore, the sector covering the production of power components.

Hitherto, many attempts have been made to obtain silicon crystals having higher oxygen content by means of zone pulling and to combine, in this manner, the advantages of zone material with those of crucible material. For example, as described in DE-A-3,333,960 or the corresponding U.S. Pat. No. 4,722,764, a crucible-pulled polycrystalline feed ingot, which, therefore, has an enhanced oxygen content is used, instead of a feed ingot produced by gas-phase deposition of polycrystalline silicon. Owing to the crucible pulling step, the material obtained has, however, an enhanced impurity level and, in addition, loses some of the oxygen as a result of degassing during the zone pulling step.

In the process as claimed in EP-A-54,657, an oxygen atmosphere is established in the zone pulling apparatus. In that case, however, it is difficult to adjust the oxygen flow so as to achieve a constant oxygen content over the entire ingot length, especially as the variation in the convection flow in the container with the change in length of the feed ingot and the product ingot can result in defects.

EP-A-140,239 describes a process in which a quartz rod is presented to the molten neck surrounded by the coil and immersed in the melt at that point, in which process it gradually dissolves and consequently delivers oxygen, and possibly also other dopants, to the silicon. However, this process results in the incorporation of oxygen in the crucible material in suitable concentration ranges only in the case of ingots having small ingot diameters. Such high rates of incorporation can no longer be achieved, however, with this method in the case of larger ingot diameters from about 75 mm upwards having correspondingly larger free melt surfaces. In addition, there is the risk that silicon starts to crystallize out at the point of immersion of the rod, as a result of the heat removal. The crystallites formed detach themselves and float on the surface of the melt to the interface with the product ingot, where they can cause the formation of dislocations. The pulling process then has to be terminated, since only dislocation-free silicon single-crystal ingots are suitable for further processing to silicon wafers.

SUMMARY OF THE INVENTION

It is, therefore, an object of the invention to provide a process for producing silicon ingots by which the above-noted disadvantages can be avoided and which makes it possible, in particular, to incorporate the oxygen distributed homogeneously in the entire crystal ingot, without the development of dislocations occurring.

It is a further object of the invention to provide ingots having diameters from about 75 mm upwards and oxygen contents comparable with crucible-pulled material by zone pulling.

These and other related objects are achieved according to the present invention by a process which comprises bringing flat quartz structures into contact with the molten cap during the pulling process.

The planar contact between the quartz shaped bodies and the molten cap makes possible the controlled incorporation of oxygen up to high concentration levels, an additional shielding effect occurring at the same time which reduces the evaporation of oxygen as silicon monoxide. Under these conditions, the rate of incorporation can be influenced by varying the size of the contact area. The advantage in the case of the process is that an increase in the contact area is always accompanied by a reduction in the free melt surface and a reduction in the contact area is correspondingly accompanied by an increase in the free melt surface, so that the incorporation effect and the degassing effect always interact in a beneficial manner. Surprisingly, it was found, furthermore, that the tendency for the development of crystallites which cause dislocations is markedly lower in the case of such planar contacts between quartz shaped bodies and the molten cap compared with in the introduction of quartz rods into the molten neck, despite the greater contact area.

The flat structures are expediently used in a form which results in a rotationally symmetrical arrangement, with respect to the longitudinal axis of the product ingot, of the regions which come into contact with the molten cap. In the case of arrangements which are composed of a plurality of individual parts and/or polygonal arrangements, a two-fold to ten-fold symmetry has proved successful in this connection. Preferably, however, the flat structures are provided in the form of circular rings which are closed upon themselves or may be composed of two or more individual parts and whose internal diameter is advantageously larger than the diameter of the molten neck, while the external diameter is less than the diameter of the product ingot which is, as a rule, a single crystal.

The rate of incorporation of the oxygen can then be influenced by means of the ratio of free melt surface to the melt surface shielded by the flat quartz structures. As a rule of thumb, it can be stated that the oxygen content achieved is roughly equivalent to that of crucible-pulled silicon if the ratio of free melt surface to covered melt surface of the molten cap coming into contact with quartz in the process according to the invention is roughly equivalent to the ratio of free melt surface and molten surface coming into contact with the crucible wall in the crucible pulling process. While this ratio, and consequently, the oxygen incorporation during the pulling process, constantly varies during the crucible pulling process owing to the falling level of the melt, it remains substantially constant in the process according to the invention, with the result that a substantially constant oxygen incorporation over the entire ingot length can also be achieved. Advantageously, the flat quartz structures are so dimensioned that the ratio between free and covered surface of the molten cap is about 1:15 to 10:1, if the additional free surface provided by the molten neck is neglected.

The rate of incorporation of the oxygen can also be further increased by increasing the surface of the flat structures wetted by the molten silicon. For this purpose, for example, the surface of the flat structures which comes into contact with the melt can be provided with elements which increase the contact area, for example, recesses or projections such as grooves, moats, or bridges. In the extreme case, apart from the shielding flat structures, additional flat structures may even be provided, which are completely immersed in the molten cap and which may be linked to the flat structures having a mainly shielding action or even be independent of the latter. A possible example of such an arrangement is provided by quartz rings which are situated in parallel about one another and are linked to one another, possibly via spacing elements like studs or bridges and the lower ring of which is completely immersed in the melt in the working position, while the other ring rests on the molten cap and shields its surface. Consequently, on the one hand, a markedly increased quartz surface which is wetted by the silicon melt and, on the other hand, also a large quartz area covering the molten cap, are made available during the pulling operation.

In the case of ingot diameters of about 100 mm, for example, the use of single circular quartz rings whose internal diameter is about 20 to 50 mm and whose external diameter is about 50 to 90 mm has proved successful.

Generally, particularly good results have been achieved with such circular rings having internal diameters which are about 0.2 to 0.5 times the diameter of the product ingot and having external diameters which are equivalent to about 0.5 to 0.9 times this value. These values are, however, to be understood only as guide values, but not in the sense of a restriction.

Since the flat structures are attacked during the pulling operation as a result of the reaction of the quartz with the silicon melt and a certain material erosion also occurs, they are expediently provided in a thickness which guarantees, despite the erosion, an adequate mechanical rigidity, even at the end of the pulling operation, in order to be able to separate them again from the melt. A thickness of the flat structures of approximately 1 to 5, in particular 1 to 2 mm, has proved successful, the lower limits possible, in principal, being determined by the mechanical rigidity necessary and the upper limits by the heat removal behavior and the available space.

In those cases in which only the introduction of oxygen into the product ingot is desirable, the flat structures are manufactured from high-purity quartz, quartz glass being used as a rule and impurity levels of not more than approximately 35 ppm by weight being aimed at, for example, as regards the content of the metals such as iron, nickel or copper and/or, in particular, of impurities with dopant action such as, for example, boron, phosphorus or aluminum, the latter often presenting particular problems in zone pulling. Any doping of the silicon necessary can, at the same time, take place in the known manner, for example, by supplying the dopants via the gas phase.

In principal, however, it is also possible to use flat structures made of quartz additionally containing dopants. This process is suitable, in particular, for those dopants such as, for instance, indium, which can only be incorporated in zone-pulled silicon via the gas phase with difficulty. If necessary, a combined process may also be exploited in which the dopants are supplied both via the gas phase and also via the flat structures.

The actual zone pulling process can be carried out in the known manner as explained, for example, in the patent literature mentioned in the preamble or in W. Dietze, W. Keller and A. Mühlbauer, "Float Zone Grown Silicon" in *Crystals*, vol. 5, (1981), Springer-Verlag, Berlin-Heidelberg-New York. Expediently, the initial phase in which the seed crystal is put in place and the diameter of the growing single crystal is gradually increased is still carried out, without the molten cap being brought into contact with the flat structure or structures. In this case, the latter can be held in a rest position which, in the case of single piece rings, is advantageously situated beneath the underside of the heating coil concentrically with the latter and above the molten cap. For multipart arrangements or arrangements which are not closed upon themselves, a rest position may also be provided, for example, into which they can be moved or swivelled outwards in the direction of the container wall away from the central axis of the system.

The necessary movements of the flat structures can be controlled, for example, by means of suitable manipulators to which the flat structures can be linked, for example, by means of fused-on connecting pieces or levers. Suitable movements are lifting and lowering movements on which, optionally, translational movements in the horizontal direction can also be superimposed.

When the planned diameter of the product ingot has been reached, the flat structures are moved from the rest position to the working position in which they are in contact with the molten cap. In this connection, it is, as a rule, adequate if the flat structures are brought lightly into contact with the molten cap surface, after which wetting with molten silicon occurs after a short time. The immersion depth is advantageously about 200 to 500 μm. Bringing into contact expediently takes place carefully and slowly in order not to alter the flow conditions in the melt abruptly and to prevent crystallization of silicon occurring at the flat structures as a result of sudden heat losses. In principal, the immersion depth can be increased to such an extent that the flat structures are completely immersed in the molten cap. However, the increase in the quartz-melt contact area is then at the expense of the loss of the shielding action of the flat structures.

When the melt has thermally stabilized again after placing the, for example, annular flat structures on the molten cap, the pulling operation can be continued with the actual ingot pulling in which a silicon ingot is produced which is, as a rule, a single crystal.

Other objects and features of the present invention will become apparent from the following detailed description considered in connection with the accompanying drawing which discloses one embodiment of the present invention. It should be understood, however, that the drawing is designed for the purpose of illustration only and not as a definition of the limits of the invention.

BRIEF DESCRIPTION OF THE DRAWING

The FIGURE illustrates diagrammatically the crucible-free zone pulling process and apparatus of the present invention.

DETAILED DESCRIPTION OF THE PREFERRED EMBODIMENT

Turning now, in detail, to the drawing, the FIGURE shows a feed ingot 1 which is composed, in general, of polycrystalline silicon and which merges at its lower end into the molten neck 3 which is surrounded by an induction heating coil 2. This neck expands to form the molten cap 4 which spans the product ingot 5 which is, as a rule, a single crystal. The crystal grows at the crystallization front 6. A flat quartz ring 7 which can be raised and lowered with the aid of a fused-on quartz lever 8 is placed on the substantially horizontally extending surface region of the molten cap 4 as the preferred embodiment of the flat structure.

Since the quartz ring is wetted by the silicon melt, slight deformations may sometimes arise in the course of the pulling operation, but, in general, these do not have a disadvantageous effect. The material erosion may also reach visible amounts in the case of fairly long ingot lengths and correspondingly long pulling operations.

Regardless of this, the standard process parameters, for example, with respect to the rotation of the feed ingot and product ingot can be maintained during pulling, it also being possible, in principal, to employ alternating directions of rotation. If a high oxygen incorporation is required, high rotational speeds of the product ingot have proved successful, since the high rotational speed of the melt surface guarantees a high rate of erosion and, consequently, incorporation.

When the planned rod length has been reached, the flat structures, i.e., the quartz ring 7 in the present case, are raised from the molten cap, and the pulling operation is terminated in the normal manner.

With the process according to the invention, it is possible to produce zone-pulled silicon ingots which have diameters of approximately 75 mm upwards and, in particular, of 100 mm and over and which are distinguished by the high purity, resistance and lifetime values which are typical of zone-pulled material. At the same time, they have oxygen contents of not less than approximately $5 \times 10^{16}$ atoms of oxygen/cm$^3$ of silicon, typically in the region of $5 \times 10^{16}$ to $10^{18}$ atoms of oxygen/cm$^3$ of silicon, such as are characteristic of crucible-pulled material. These values can be determined with the aid of infra-red absorption measurements (cf. for example, ASTM standard F 120 and F 121). The same applies to the silicon wafers produced from these ingots after the standard further processing which comprises, as a rule, at least one sawing step also usually a subsequent lapping operation and, optionally, a polishing step and which are normally delivered to the customer in sawn, lapped or polished form. The zone-pulled material has, at the same time, an impurity level which is markedly lower compared with crucible-pulled silicon, in particular, as regards the dopant content and in the main the boron, phosphorus and aluminum content, which is typically $1-2 \times 10^{13}$/cm$^3$ in the case of the latter, while it is typically about $1-2 \times 10^{12}$/cm$^3$ in the case of the former. These values can be determined, for example, with the aid of photoluminescence investigations, cf. in this connection, for example, P. M. Colley and E. C. Lightowlers, *Semicond. Sci. Technol.*, Volume 2, page 157, (1987).

The microscopic variation of the dopant distribution or impurity distribution, which can be determined, for example, with the aid of the so-called "spreading resistance" method of measurement (cf. in this connection, for example, ASTM procedure F 525 (1977)) by determining the profiles of the spreading resistance, also exhibits the "striations" which are typical of zone-pulled material and which can be observed to a less pronounced extent in crucible-pulled material. Conversely, the ingots are distinguished by the flat axial resistance distribution typical of zone-pulled silicon, while crucible-pulled ingots exhibit a marked axial variation of this parameter.

With the aid of the process according to the invention, silicon ingots and silicon wafers having diameters of above approximately 75 mm and, in particular, of approximately 100 mm and over, which combine in themselves the purity advantages of zone-pulled material and the advantages of crucible-pulled material based on the enhanced oxygen content consequently become obtainable.

The process is illustrated in more detail below with reference to the following exemplary embodiments.

EXAMPLE 1

A commercial arrangement for crucible-free zone pulling of silicon single crystals having diameters of up to about 100 mm had been suitably converted for carrying out the process according to the invention. For this purpose, there was provided beneath the flat underside of the single-turn heating coil a flat ring of high purity quartz glass (internal diameter approximately 40 mm, external diameter approximately 60 mm, boron content less than approximately 2 ppm by weight, phosphorus content less than approximately 3 ppm by weight, aluminum content approximately 20 ppm by weight). The quartz ring was arranged concentrically to and parallel with the heating coil, to which ring a quartz rod was fused on in a similar manner to the arrangement shown in the FIGURE. This rod was linked to a manipulator which was let into the wall of the container and with whose aid the quartz ring could be lowered and moved upwards again. In the rest position, the quartz ring was situated immediately below the underside of the coil.

In the initial phase of the pulling operation, in which the seed crystal is brought up to the polycrystalline feed ingot and the conically expanding starting piece of the product ingot was pulled, the quartz ring was left in the rest position. On reaching the planned ingot diameter of approximately 75 mm, i.e., at the beginning of the actual ingot pulling, the quartz ring was gradually lowered until its entire underside had come into contact with the molten cap surface. After the molten zone had stabilized again it was then possible to pull the single crystal. In doing this, an opposite rotation of feed ingot and product ingot was established in the normal conventional manner. An argon atmosphere was present in the container; doping gas was not supplied. Under these conditions, an ingot having a length of about 30 cm was pulled.

The quartz ring was then raised from the molten cap and returned to the rest position. It was then possible to separate the product ingot from the feed ingot and finally to remove it.

The boron, phosphorus and aluminum content at both ends of the ingot were determined with the aid of the photoluminescence method. At the ingot end facing the seed crystal, the values (expressed in all cases as the specific resistance corresponding to the measured proportion) were 3,200 Ω cm for boron and 1,228 Ω cm for phosphorus, while the value for aluminum was below the level of detection. At the ingot end facing the feed ingot, 3,628 Ω cm was found for boron, 2,458 Ω cm for phosphorus and 2,180 Ω cm for aluminum.

The oxygen content at this end of the ingot was determined as $5.15 \times 10^{17}$ atoms of oxygen/cm$^3$ of silicon by infra-red absorption measurement in accordance with ASTM standard F 120/F 121. At the other end of the ingot, this value was $5.53 \times 10^{17}$ atoms of oxygen/cm$^3$ of silicon.

EXAMPLE 2

Three dislocation-free silicon single crystals having diameters of approximately 104 mm and ingot lengths of about 50–70 cm were pulled in the arrangement specified in Example 1 by the process mentioned therein. In each pulling operation, quartz rings whose thickness was 1 mm in all cases, but which had different internal and external diameters were again used as flat structures. The rings were in all cases lowered onto the molten cap from the rest position after the specified diameter had been reached and left there in contact with the melt until the planned ingot length had been reached. They were then raised and returned to the rest position, after which the pulling process was terminated. The oxygen concentration was then determined at both ingot ends by means of infra-red absorption measurements in accordance with ASTM standard F 120/F 121. The results are listed in the table below.

TABLE

Change in the Oxygen Concentration When the Dimensions of the Quartz Rings Used Are Changed

| Quartz Ring Diameter (mm) | | Melt Surface covered/free | Oxygen Concentration ($10^{17}$ at/cm$^3$) | |
|---|---|---|---|---|
| internal | external | | seed end | feed end |
| 40 | 50 | 1:11 | 2.25 | 2.55 |
| 50 | 60 | 1:9 | 3.05 | 2.61 |
| 40 | 60 | 1:4 | 4.68 | 4.88 |

It becomes clear that the proportion of oxygen incorporated in the silicon can also be increased by increasing the area of the quartz rings. In addition, a good axial consistency of the oxygen concentration is revealed.

COMPARISON EXAMPLE

As a comparison, a further silicon ingot having a diameter of about 75 mm was pulled, but, in this case, no flat quartz structures were placed on the molten cap, but a quartz rod (diameter approximately 3 mm) was introduced into the molten neck. In other respects, the same pulling parameters were maintained as in Example 1.

An ingot length of about 25 cm, the quartz rod was removed from the molten neck, and the pulling operation was terminated. The oxygen content, determined by the same method as in Example 1, of the silicon ingot obtained in this manner was $3 \times 10^{16}$ atoms of oxygen/cm$^3$ of silicon at the ingot end facing the seed crystal and $4 \times 10^{16}$ atoms of oxygen/cm$^3$ of silicon at the ingot end facing the feed ingot.

While only several examples of the present invention have been shown and described, it is to be understood that many changes and modifications may be made thereunto, without departing from the spirit and scope of the present invention.

What is claimed is:

1. A process for producing silicon ingots having a high oxygen content by crucible-free zone pulling comprising the steps of:
   producing a molten zone between a feed ingot and a product ingot by means of a surrounding induction heating coil having a generally annular hole, said molten zone, starting from the feed ingot, passing through the annular hole of the coil in the form of a relatively narrow molten neck and then expands to form a molten cap covering the product ingot;
   subjecting said ingot to a crucible-free zone pulling by effecting relative movement between said ingots and said coil, so that said melting zone traverses said feed ingot;
   contacting said molten cap with at least one flat quartz element during said zone pulling step; and
   wherein a substantially constant oxygen incorporation over the entire ingot length is achieved.

2. The process as claimed in claim 1, wherein said quartz element comprises an annular flat element whose internal diameter is larger than the diameter of the molten neck and whose external diameter is less than the diameter of the product ingot.

3. The process as claimed in claim 1, wherein said flat element is brought into contact with said molten cap in the initial phase of the pulling operation after the planned diameter of the product ingot has been reached and is removed from said molten cap in the final phase of the pulling operation after the planned ingot length has been reached.

4. The process as claimed in claim 1, wherein the ratio between the free surface of the molten cap and the surface of the molten cap covered by said flat element is 1:15 to 10:1, without allowance being made for the molten neck.

5. The process as claimed in claim 1, wherein said flat quartz element comprises high purity quartz whose content of impurities with dopant action is not more than approximately 35 ppm by weight.

6. The process as claimed in claim 1, additionally including the step of slicing said product ingot after said zone pulling step into wafers.

7. A silicon wafer obtained from silicon ingots by the process as claimed in claim 6.

8. A silicon ingot having a diameter of not less than 75 mm and an oxygen content of not less than $5 \times 10^{16}$ atoms of oxygen/cm$^3$ of silicon obtained by the process as claimed in claim 1.

9. A process for producing a silicon ingot having a high oxygen content by crucible-free zone pulling comprising the steps of:

producing a molten zone between a feed ingot and a product ingot by means of a surrounding induction heating coil having a generally annular hole, said molten zone, starting from the feed ingot, passing through the annular hole of the coil in the form of a relatively narrow molten neck and then expands to form a molten cap covering the product ingot;

subjecting said ingot to a crucible-free zone pulling by effecting relative movement between said ingots and said coil, so that said melting zone traverses said feed ingot;

contacting said molten cap with at least one flat quartz element zone during said zone pulling step;

wherein said quartz element zone comprises an annular flat element zone whose internal diameter is larger than the diameter of the molten neck and whose external diameter is less than the diameter of the product ingot;

wherein the ratio between the free surface at the molten cap and the surface of the molten cap covered by said flat element zone is 4:1 to 9:1, without allowance being made for the molten neck; and wherein a substantially constant oxygen incorporation over the entire ingot length is achieved.

* * * * *